(12) United States Patent
Matsuda et al.

(10) Patent No.: US 11,434,370 B2
(45) Date of Patent: Sep. 6, 2022

(54) SILICONE GEL COMPOSITION, CURED PRODUCT THEREOF, AND POWER MODULE

(71) Applicant: SHIN-ETSU CHEMICAL CO., LTD., Tokyo (JP)

(72) Inventors: Tsuyoshi Matsuda, Annaka (JP); Takafumi Sakamoto, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 161 days.

(21) Appl. No.: 16/982,457

(22) PCT Filed: Feb. 26, 2019

(86) PCT No.: PCT/JP2019/007230
§ 371 (c)(1),
(2) Date: Sep. 18, 2020

(87) PCT Pub. No.: WO2019/181381
PCT Pub. Date: Sep. 26, 2019

(65) Prior Publication Data
US 2021/0054200 A1 Feb. 25, 2021

(30) Foreign Application Priority Data

Mar. 20, 2018 (JP) .............................. JP2018-052673

(51) Int. Cl.
*C08L 83/04* (2006.01)
*H01L 23/29* (2006.01)

(52) U.S. Cl.
CPC ............ *C08L 83/04* (2013.01); *H01L 23/296* (2013.01)

(58) Field of Classification Search
CPC ......... C08G 77/12; C08G 77/20; C08L 83/04; B01J 23/40; H01L 23/296
See application file for complete search history.

(56) References Cited

U.S. PATENT DOCUMENTS

| 5,942,591 A | 8/1999 | Itoh et al. |
| 2005/0250903 A1 | 11/2005 | Tanaka et al. |
| 2015/0141607 A1 | 5/2015 | Ko et al. |
| 2017/0174841 A1 | 6/2017 | Iguchi et al. |

FOREIGN PATENT DOCUMENTS

| JP | 6-293881 A | 10/1994 |
| JP | 06293881 | * 10/1994 |
| JP | 9-78032 A | 3/1997 |
| JP | 2003-128925 A | 5/2003 |
| JP | 2005-344106 A | 12/2005 |
| JP | 2010-120979 A | 6/2010 |
| JP | 2010-144130 A | 7/2010 |
| JP | 2017-14399 A | 1/2017 |
| JP | 2017-75333 A | 4/2017 |
| JP | 2017-115116 A | 6/2017 |

OTHER PUBLICATIONS

JP 06 293881 machine translation (1994).*
International Search Report (PCT/ISA/210) issued in PCT/JP2019/007230, dated Jun. 4, 2019.
Written Opinion of the International Searching Authority (PCT/ISA/237) issued in PCT/JP2019/007230, dated Jun. 4, 2019.
Office Action dated Jun. 29, 2021, in Japanese Patent Application No. 2020-507460.

* cited by examiner

*Primary Examiner* — Kuo Liang Peng
(74) *Attorney, Agent, or Firm* — Birch, Stewart, Kolasch & Birch, LLP

(57) ABSTRACT

Provided is a silicone gel composition containing, as essential components:

(A) an organopolysiloxane containing an alkenyl group bonded to two or more silicon atoms in one molecule, the organopolysiloxane comprising (a-1) a branched organopolysiloxane having an alkenyl group bonded to three or more silicon atoms only at an end of a molecular chain in one predetermined molecule, and (a-2) a linear organopolysiloxane having an alkenyl group bonded to two or more silicon atoms only at both ends of a molecular chain in one predetermined molecule;

(B) a linear organohydrogenpolysiloxane containing hydrogen atoms bonded to two or more silicon atoms in one predetermined molecule; and (C) a platinum-based curing catalyst.

Curing the silicone gel can provide a silicone gel cured product which has a degree of penetration of 40-100 as defined according to JIS K2220, has a free oil content of 15 mass % or less, has a low modulus and low stress, and does not exhibit oil bleeding over time.

4 Claims, No Drawings

SILICONE GEL COMPOSITION, CURED PRODUCT THEREOF, AND POWER MODULE

TECHNICAL FIELD

The present invention relates to a silicone gel composition, a cured product thereof (silicone gel), and the like, which provide a silicone gel cured product without oil bleeding over time.

BACKGROUND ART

Silicone gel composition is addition reaction-curable organopolysiloxane compositions comprising an organohydrogenpolysiloxane having a hydrogen atom bonded to a silicon atom (i.e., a SiH group), an organopolysiloxane having an alkenyl group such as a vinyl group bonded to a silicon atom, and further, a platinum-based curing catalyst, from which a cured product is obtained by an addition reaction of the hydrogen atom bonded to the silicon atom to the alkenyl group. The silicone gel cured product obtained by heating the foregoing organopolysiloxane composition is excellent in heat resistance, weather resistance, oil resistance, cold resistance, and electrical insulation, and also low elastic modulus and low stress, and thus it is used as sealing materials for electronic parts such as power devices.

The low elastic modulus and low stress of the silicone gel cured product are properties that are not found in other elastomer products, and achieved by reducing the crosslinking density in the silicone gel cured product, with reducing an amount of organohydrogenpolysiloxane contained in the composition, or with compounding a so-called non-functional organopolysiloxane oil that has no reactivity.

As a result, the silicone gel cured product contains therein a free oil such as an unreacted organopolysiloxane and an oil component that is not incorporated into the crosslinking. When the silicone gel cured product containing such a free oil is used as a sealing material for electronic parts, the free oil in the silicone gel cured product bleeds over time due to vibration and temperature change, and depending on the materials or designs of electronic part cases, the electronic parts such as surrounding electronic substrates or terminals may be contaminated, which may cause a problem.

Examples of the method for reducing such oil bleeding include 1) a method of increasing the crosslinking density to reduce the free oil content, 2) a method of mixing a filler, and 3) a method of mixing an oil that is an extremely high-molecular-weight component. The method 1) is, however, likely to fail to provide the properties of the silicone gel cured product with low elastic modulus and low stress, and the methods 2) and 3) lead to a decrease in oil bleeding speed, but increase the viscosity, thereby significantly decreasing the workability.

Accordingly, there has been a demand for the development of a silicone gel composition that provides a cured product that has the properties of the silicone gel cured product: low modulus and low stress, further without any concern for oil bleeding over time.

It is to be noted that prior art related to the present invention include JP-A 2017-14399 (Patent Document 1).

PRIOR ART DOCUMENTS

Patent Documents

Patent Document 1: JP-A 2017-14399

SUMMARY OF INVENTION

Technical Problem

The present invention has been achieved in view of the above-mentioned circumstances, and an object of the present invention is to provide a silicone gel composition intended to provide a silicone gel cured product that is low elastic modulus and low stress without any concern for oil bleeding over time.

Solution to Problem

The inventors have found that, as a result of carrying out earnest studies to achieve the above-mentioned object, the combined use of linear and specific branched organopolysiloxanes each having an alkenyl group at a molecular chain end as a main component of a silicone gel composition allows the above-mentioned problems to be solved, thereby achieving the present invention.

More specifically, the present invention provides the following silicone gel composition, a silicone gel that is a cured product of the composition, a power module, and the like.

1.
A silicone gel composition comprising the following components (A), (B) and (C), which is cured to provide a silicone gel cured product that has a degree of penetration of 40 to 100 specified by JIS K 2220 and a free oil content of 15% by weight or less:

(A) 100 parts by weight of an organopolysiloxane containing at least two alkenyl groups bonded to silicon atoms in one molecule, comprising the following component (a-1) and component (a-2), provided that the weight ratio of the component (a-1) in the component (A): (a-1)/{(a-1)+(a-2)} is 0.1 to 0.5;

(a-1) a branched organopolysiloxane represented by the following general formula (1), having at least three alkenyl groups bonded to silicon atoms only at end of molecular chain in one molecule:

$$(R^1_a R^2_{3-a}SiO_{1/2})_p(R^2_2SiO)_q(R^2SiO_{3/2})_r \qquad (1)$$

wherein $R^1$ is an identical or different alkenyl group having 2 to 10 carbon atoms, $R^2$ is an identical or different monovalent hydrocarbon group having 1 to 10 carbon atoms, excluding aliphatic unsaturated groups, a is 1 or 2, p, q and r are respectively integers of $3 \leq p$, $50 \leq q$, $1 \leq r \leq 10$, with $r<p$ and $0.001 \leq r/q \leq 0.2$, (a-2) a linear organopolysiloxane represented by the following general formula (2), having at least two alkenyl groups bonded to silicon atoms only at both ends of molecular chain in one molecule:

$$(R^1_a R^2_{3-a}SiO_{1/2})_2(R^2_2SiO)_s \qquad (2)$$

wherein $R^1$, $R^2$ and a are as mentioned above, and s is an integer of 10 to 1,000, (B) a linear organohydrogenpolysiloxane represented by the following average composition formula (3), containing at least two hydrogen atoms bonded to silicon atoms in one molecule in an amount such that hydrogen atoms bonded to silicon atoms in the component (B) are 0.8 to 2 mol per 1 mol in total of alkenyl groups in the component (A):

$$(H_b R^3_{3-b}SiO_{1/2})_t(HR^3SiO)_u(R^3_2SiO)_{1-t-u} \qquad (3)$$

wherein $R^3$ is an identical or different monovalent hydrocarbon group having 1 to 10 carbon atoms, excluding aliphatic unsaturated groups, b is 1 or 2, t is a positive number of 0.001 to 0.3, and u is a number from 0 to 0.2, and (C) an effective amount as a catalyst of a platinum-based curing catalyst.

2.

The silicone gel composition according to 1, wherein in the general formula (1) of the component (a-1), $0.003 \leq r/q \leq 0.015$.

3.

A silicone gel cured product which is a cured product of the silicone gel composition according to 1 or 2, wherein the cured product has a degree of penetration of 40 to 100 specified by JIS K 2220 and a free oil content of 15% by weight or less.

4.

A power module comprising a layer of the silicone gel cured product according to 3.

Advantageous Effects of Invention

The silicone gel composition according to the present invention is intended to provide a silicone gel cured product that maintains low elastic modulus and low stress as properties of the silicone gel cured product, and has no concern for free oil bleeding over time. More specifically, if the silicone gel cured product obtained by curing the composition according to the present invention is used as a sealing material for electronic parts such as power devices, there is no possibility of contamination by oil bleeding, regardless of the usage environment.

DESCRIPTION OF EMBODIMENTS

The silicone gel composition according to the present invention comprising the following components (A) to (C) as essential components. It is to be noted that in the present invention, the silicone gel cured product (or silicone gel) refers to a cured product that has a low crosslinking density with an organopolysiloxane as a main component, and has a degree of penetration of 10 to 100 in accordance with JIS K 2220 (¼ cone). This product corresponds to a product that is low crosslinking density, low hardness (i.e., soft), and low stress (low elasticity), to such an extent that the measured value (rubber hardness value) is 0 in a rubber hardness measurement in accordance with JIS K6301 without showing no effective rubber hardness value, and in this respect, differ from a so-called elastomer-like silicone rubber cured product (rubber-like elastic body). Further, the numerical range "A to B" includes the numerical values at both ends of the range (i.e., A or more and B or less).

Hereinafter, the present invention is described in detail.
[Component (A)]

The organopolysiloxane of a component (A) for use in the present invention, which serves as a main component (base polymer) for the silicone gel composition, is an organopolysiloxane having at least two alkenyl groups bonded to silicon atoms (hereinafter, also referred to as "silicon atom-bonded alkenyl groups") in one molecule. In addition, the component (A) is composed of two types of organopolysiloxanes (a-1) and (a-2).

The component (a-1) is a branched organopolysiloxane represented by the following general formula (1), having at least three alkenyl groups bonded to silicon atoms only at end of molecular chain in one molecule:

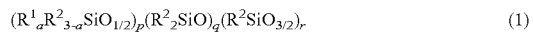

(1)

wherein $R^1$ is an identical or different alkenyl group having 2 to 10 carbon atoms, $R^2$ is an identical or different monovalent hydrocarbon group having 1 to 10 carbon atoms, excluding aliphatic unsaturated groups, a is 1 or 2, p, q and r are respectively integers of $3 \leq p$, $50 \leq q$, $1 \leq r \leq 10$, with $r < p$ and $0.001 \leq r/q \leq 0.2$.

The organopolysiloxane of the component (a-1) is a branched organopolysiloxane having at least three (typically 3 to 10, preferably 3 to 8, more preferably 3 to 6) alkenyl groups bonded to silicon atoms ($R^1$, hereinafter, referred to as "silicon atom-bonded alkenyl group") in one molecule, and not limited except for containing the silicon atom-bonded alkenyl groups as monofunctional organosiloxane units represented by $(R^1_a R^2_{3-a} SiO_{1/2})$ only at end of molecular chain.

Specific examples of the silicon atom-bonded alkenyl group in the component (a-1) include vinyl, allyl, propenyl, isopropenyl, butenyl, isobutenyl, pentenyl, hexenyl, cyclohexenyl and heptenyl groups having 2 to 10 carbon atoms, and in particular, vinyl group is preferred.

In the component (a-1), the silicon atom-bonded alkenyl group content is preferably 0.001 to 1 mol, particularly preferably 0.005 to 0.5 mol in 100 g of the component.

In the above-mentioned formula (1), $R^2$ is an identical or different monovalent hydrocarbon group, excluding aliphatic unsaturated groups, and preferably an unsubstituted or substituted monovalent hydrocarbon group typically having 1 to 10, preferably 1 to 6 carbon atoms, examples of the monovalent hydrocarbon group include alkyl groups such as a methyl group, an ethyl group, a propyl group, a butyl group, a pentyl group, a hexyl group, and a heptyl group; cycloalkyl groups such as a cyclohexyl group; aryl groups such as a phenyl group, a tolyl group, a xylyl group, and a naphthyl group; aralkyl groups such as a benzyl group and a phenethyl group; and alkyl halide groups such as a chloromethyl group, 3-chloropropyl group, and 3,3,3-trifluoropropyl group, where some or all of the hydrogen atoms of the foregoing hydrocarbon groups are substituted with a halogen atom such as a chlorine atom, a fluorine atom or a bromine atom, and monovalent hydrocarbon group is preferably an unsubstituted monovalent hydrocarbon group having no aliphatic unsaturated bond such as alkyl group and aryl group, more preferably a methyl group or a phenyl group.

Further, in the above-mentioned formula (1), a is 1 or 2. Furthermore, p, q, r, r/q are integers that satisfy $3 \leq p$, $50 \leq q$, $1 \leq r \leq 10$, $r < p$ (typically $r = p-2$), with $0.001 \leq r/q \leq 0.2$, preferably, p is an integer of 3 to 7, q is an integer of 50 to 800, and r is an integer of 1 to 5, with $0.002 \leq r/q \leq 0.1$, more preferably, p is an integer of 3 to 5, q is an integer of 100 to 500, and r is an integer of 1 to 3, with $0.003 \leq r/q \leq 0.05$, still more preferably, p is an integer of 3 to 5, q is an integer of 100 to 300, and r is 1 or 2, with $0.003 \leq r/q \leq 0.015$. It is to be noted that r less than 1 makes it impossible to obtain a silicone gel cured product, whereas r over 10 not only makes it difficult to obtain a silicone gel cured product that is low elastic modulus and low stress, but also causes a uniform cured product surface to be dense and sparse, thus decreasing the displacement durability of the cured product.

It is to be noted that in the present invention, the degree of polymerization (or molecular weight) can be usually determined as a polystyrene-equivalent number average degree of polymerization (or number average molecular weight) or the like in gel permeation chromatography (GPC) analysis with toluene or the like as a developing solvent (hereinafter, the same).

The molecular structure of the component (a-1) is not particularly limited as long as it has a branched structure that satisfies the above-mentioned requirements, and the component (a-1) is synthesized by a conventionally known method.

The viscosity of the branched organopolysiloxane of the component (a-1) at 25° C. is typically 10 to 10,000 mPa·s, preferably 30 to 2,000 mPa·s, more preferably 50 to 1,000 mPa·s, and is desirably liquid at room temperature (25° C.). It is to be noted that in the present invention, the viscosity can be measured by a rotational viscometer (for example, BL type, BH type, BS type, cone plate type, rheometer, etc.) (hereinafter, the same).

Specific examples of the branched organopolysiloxane of the component (a-1) include organopolysiloxanes represented by the following general formula:

[Chem. 1]

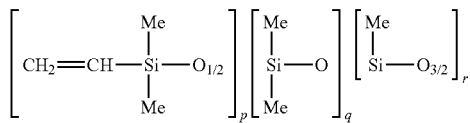

wherein Me represents a methyl group, p, q and r are respectively integers of 3≤p, 50≤q, 1≤r≤10, with r<p and 0.001≤r/q≤0.2.

For the branched organopolysiloxane of the component (a-1), one organopolysiloxane may be used alone, or two or more organopolysiloxanes may be used in combination.

The component (a-2), represented by the following general formula (2), is a linear organopolysiloxane having at least two alkenyl groups bonded to silicon atoms only at both ends of molecular chain in one molecule, and free of branched structure in the molecule:

$$(R^1_a R^2_{3-a} SiO_{1/2})_2 (R^2_2 SiO)_s \quad (2)$$

wherein $R^1$, $R^2$, and a are as mentioned above, and s is an integer of 10 to 1,000.

The organopolysiloxane of the component (a-2) is a linear organopolysiloxane having at least two (typically 2 to 4, preferably approximately 2 or 3) silicon atom-bonded alkenyl groups in one molecule, and not limited except for containing the silicon atom-bonded alkenyl groups as monofunctional organosiloxy units represented by $(R^1_a R^2_{3-a} SiO_{1/2})$ only at both ends of molecular chain.

Specific examples of the silicon atom-bonded alkenyl group in the component (a-2) include vinyl, allyl, propenyl, isopropenyl, butenyl, isobutenyl, pentenyl, hexenyl, cyclohexenyl and heptenyl groups having 2 to 10 carbon atoms, and in particular, vinyl group is preferred.

In the above-mentioned formula (2), s is an integer of 10 to 1,000, preferably an integer of 50 to 900, more preferably an integer of 100 to 600. s over 1,000 makes it impossible to obtain a silicone gel cured product, whereas s less than 10 causes a cured product surface to be dense and sparse, thus decreasing the displacement durability of the cured product.

The molecular structure of the component (a-2) is not particularly limited as long as it has a structure that satisfies the above-mentioned requirements (i.e., a linear diorganopolysiloxane blocked with alkenyl group-containing organosiloxy groups at both ends of molecular chain), and the component (a-2) is synthesized by a conventionally known method.

The viscosity of the linear organopolysiloxane (a-2) at 25° C. is typically 100 to 10,000 mPa·s, preferably 200 to 8,000 mPa·s, more preferably 400 to 5,000 mPa·s, and is desirably liquid at room temperature (25° C.). Further, for the same reason, the number of silicon atoms (or the degree of polymerization) in the component (a-2) is typically 10 to 1,000, preferably 50 to 900, more preferably 100 to 600.

Specific examples of the linear diorganopolysiloxane (linear diorganopolysiloxane blocked with alkenyl group-containing organosiloxy groups at both ends of molecular chain) of the component (a-2) include diorganopolysiloxanes represented by the following general formula:

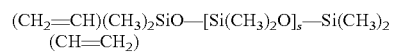

wherein s is an integer of 10 to 1,000.

For the linear organopolysiloxane of the component (a-2), one organopolysiloxane may be used alone, or two or more organopolysiloxanes may be used in combination.

The ratio between the above-mentioned components (a-1) and (a-2) used as the component (A) is (a-1):(a-2) of 1:1 to 1:9, preferably 1:2 to 1:4 in weight ratio. More specifically, the weight ratio of the component (a-1) in the component (A): (a-1)/{(a-1)+(a-2)} is 0.1 to 0.5, preferably 0.2 to 0.33. The excessively large amount of the component (a-1) may significantly increase the degree of penetration, thereby making it impossible to adjust the degree to a desired degree of penetration, whereas the excessively small amount thereof may interfere with curing as a silicone gel. It is to be noted that the total of the components (a-1) and (a-2) in the component (A) is 100% by weight.

[Component (B)]

The organohydrogenpolysiloxane of the component (B) for use in the present invention is a component that acts as a crosslinking agent (curing agent) in the addition curing reaction of hydrosilylation with the component (A). The component (B), represented by the following average composition formula (3), is a linear organohydrogenpolysiloxane having at least two, preferably three or more hydrogen atoms bonded to silicon atoms (hereinafter, also referred to as "silicon atom-bonded hydrogen atoms" (i.e., SiH groups)) in one molecule. More specifically, the linear organohydrogenpolysiloxane of the component (B) is a linear organohydrogenpolysiloxane that has one or two (i.e., two to four in one molecule) silicon atom-bonded hydrogen atoms (SiH groups) on each of the silicon atoms at both ends of the molecular chain, and may contain one or more silicon atom-bonded hydrogen atoms (SiH groups) on silicon atoms in a bifunctional siloxane unit constituting the main chain (non-ends (terminals) or midway in a molecular chain).

$$(H_b R^3_{3-b} SiO_{1/2})_t (HR^3 SiO)_u (R^3_2 SiO)_{1-t-u} \quad (3)$$

wherein $R^3$ is an identical or different monovalent hydrocarbon group having 1 to 10 carbon atoms, excluding aliphatic unsaturated groups, b is 1 or 2, t is a positive number of 0.001 to 0.3, and u is a number from 0 to 0.2.)

It is to be noted that in the average composition formula (3), the total of the ratios of the $(H_b R^3_{3-b} SiO_{1/2})$ unit, $(HR^3 SiO)$ unit and $(R^3_2 SiO)$ unit in the molecule of the component (B) (i.e., t+u+(1−t−u)) is 1.

In the above-mentioned average composition formula (3), $R^3$ is an identical or different monovalent hydrocarbon group, excluding aliphatic unsaturated groups, preferably an unsubstituted or substituted monovalent hydrocarbon group typically having 1 to 10, preferably 1 to 6 carbon atoms, examples of the monovalent hydrocarbon group include alkyl groups such as a methyl group, an ethyl group, a propyl group, a butyl group, a pentyl group, a hexyl group, and a heptyl group; cycloalkyl groups such as a cyclohexyl group;

aryl groups such as a phenyl group, a tolyl group, a xylyl group, and a naphthyl group; aralkyl groups such as a benzyl group and a phenethyl group; and alkyl halide groups such as a chloromethyl group, 3-chloropropyl group, and 3,3,3-trifluoropropyl group, where some or all of the hydrogen atoms of the foregoing hydrocarbon groups are substituted with a halogen atom such as a chlorine atom, a fluorine atom or a bromine atom, and monovalent hydrocarbon group is preferably an unsubstituted monovalent hydrocarbon group having no aliphatic unsaturated bond such as alkyl group and aryl group, more preferably a methyl group or a phenyl group.

In the above-mentioned formula (3), b is 1 or 2. Furthermore, t is a positive number of 0.001 to 0.3, preferably a positive number of 0.006 to 0.2, more preferably a positive number of 0.013 to 0.1, and u is a number of 0 to 0.2, preferably a number of 0 to 0.12. t of less than 0.001 makes it impossible to obtain a silicone gel cured product with a desired degree of penetration, whereas r over 0.3 not only makes it difficult to obtain a silicone gel cured product that is low elastic modulus and low stress, but also causes a cured product surface to be dense and sparse, thus decreasing the displacement durability of the cured product.

The molecular structure of the component (B) is not particularly limited as long as it has a structure that satisfies the above-mentioned requirements, and the component (B) is synthesized by a conventionally known method.

The viscosity of the organohydrogenpolysiloxane of the component (B) at 25° C. desirably falls within the range of liquid at room temperature (25° C.), which satisfies the range of preferably 0.1 to 5,000 mPa·s, more preferably 0.5 to 1,000 mPa·s, particularly preferably 2 to 500 mPa·s, because the workability of the composition and the optical or mechanical properties of the cured product are more excellent. If the viscosity is satisfied, the number of silicon atoms (or the degree of polymerization) in one molecule of the organohydrogenpolysiloxane is typically 2 to 1,000, preferably 3 to 300, more preferably 5 to 150.

Specific examples of the linear organohydrogenpolysiloxane of the component (B) include organohydrogenpolysiloxanes represented by the following general composition formula:

[Chem. 2]

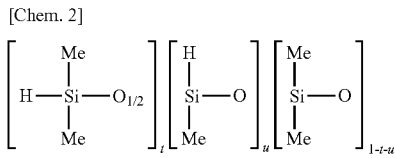

wherein Me represents a methyl group, t is a positive number of 0.001 to 0.3, and u is a number of 0 to 0.2.

For the organohydrogenpolysiloxane of the component (B), one organohydrogenpolysiloxane may be used alone, or two or more organohydrogenpolysiloxanes may be used in combination.

The amount of the component (B) added is adapted such that the total of silicon atom-bonded hydrogen atoms (SiH groups) in the component (B) is 0.8 to 2 mol, preferably 0.8 to 1.8 mol, more preferably 0.9 to 1.5 mol, still more preferably 0.9 to 1.2 mol per 1 mol of the total of silicon atom-bonded alkenyl groups in the component (A). If the silicon atom-bonded hydrogen atoms from the component (B) are less than 0.8 mol per 1 mol of the silicon atom-bonded alkenyl groups in the component (A), a sufficient effect of oil bleeding reduction cannot be obtained. Furthermore, if the silicon atom-bonded hydrogen atoms are more than 2 mol, the component that is not incorporated into the crosslinking is increased, thus making it impossible to obtain a sufficient effect of oil bleeding reduction.

[Component (C)]

The component (C) in the present invention is intended for use as a catalyst for promoting the addition reaction between the silicon atom-bonded alkenyl groups in the component (A) and the silicon atom-bonded hydrogen atoms in the component (B). The component (C) is a platinum-based curing catalyst (platinum or platinum-based compound), for which known catalysts can be used. Specific examples thereof include platinum-group metal catalysts such as: platinum black, chloroplatinic acid, alcohol-modified compounds of chloroplatinic acid or its delivertives; and complex of chloroplatinic acid with compound such as olefin, aldehyde, vinyl siloxane or acetylene alcohol.

The compounding amount of the component (C), which may be an effective amount and can be appropriately increased or decreased depending on the desired curing rate, typically falls within the range of 0.1 to 1,000 ppm, preferably 1 to 300 ppm based on the weight of the platinum-group metal atom with respect to the total amount of the component (A) and the component (B). If this compounding amount is excessive large, the heat resistance of the obtained cured product may be decreased.

The silicone gel composition in the present invention can be compounded with, in addition to the components (A) to (C) mentioned above, optional components without impairing the object of the present invention. Examples of the optional components include a reaction inhibitor, an inorganic filler, an organopolysiloxane free of silicon atom-bonded hydrogen atoms and silicon atom-bonded alkenyl groups, and an adhesiveness imparting agent such as an alkoxyorganosilane that contributes to the improvement of adhesiveness or tackiness, a heat resistance additive, a flame retardancy imparting agent, a thixotropy imparting agent, a pigment, and a dye.

The reaction inhibitor is a component for inhibiting the reaction of the composition, and specific examples thereof include acetylene-based, amine-based, carboxylic acid ester-based, phosphite ester-based reaction inhibitors.

Examples of the inorganic filler include inorganic fillers such as fumed silica, crystalline silica, precipitated silica, hollow filler, silsesquioxane, fumed titanium dioxide, magnesium oxide, zinc oxide, iron oxide, aluminum hydroxide, magnesium carbonate, calcium carbonate, zinc carbonate, layered mica, diatomaceous earth, and glass fibers; and these fillers subjected to surface-hydrophobic treatment with organosilicon compounds such as organoalkoxysilane compound, organochlorosilane compound, organosilazane compound or low-molecular-weight siloxane compound. In addition, silicone rubber powder, silicone resin powder, and the like may be compounded.

The silicone gel composition in the present invention can be obtained by uniformly mixing the components (A) to (C) and other optional components in predetermined amounts. In that regard, the components to be mixed may be, if necessary, divided into two parts or more parts, for example, can be also divided into a part composed of a part of the component (A) and the component (C), and a part composed of the remainder of the component (A) and the component (B), and then mixed. Here, examples of the mixing means used include a homomixer, a paddle mixer, a homodisper, a colloid mill, a vacuum mixing stirring mixer, and a planetary mixer, but the mixing means is not to be considered particularly limited as long as at least the components (A) to (C) are uniformly mixed.

The curing conditions for the silicone gel composition in the present invention can be 23 to 150° C., in particular, 60 to 120° C., for 10 minutes to 8 hours, in particular, 30 minutes to 5 hours.

The cured product of the silicone gel composition, obtained by curing the silicone gel composition in the present invention, has a degree of penetration from 40 to 100, preferably 50 to 80, specified by JIS K 2220, which is a soft (i.e., large in penetration value and excellently lower in stress) silicone gel among common silicone gel cured products. Furthermore, the free oil content in the obtained silicone gel cured product (the amount of the organopolysiloxane composed of the component (A) and/or the component (B) uncrosslinked, that is, left without participating in the crosslinking reaction caused by the addition reaction of hydrosilylation) is preferably 15% by weight or less (0 to 15% by weight, in particular, 0 to 10% by weight) with respect to the weight of the whole silicone gel cured product, from the viewpoint of suppressing oil bleeding over time. It is to be noted that the free oil content in the silicone gel cured product can be evaluated by, for example, a method of immersing the cured product in an organic solvent such as toluene to extract the free oil component. More specifically, in the present invention, "the free oil content in the silicone gel cured product" means the extraction amount of the free oil component extracted from the silicone gel cured product under the following conditions (processing conditions in the measurement of the free oil content in the examples described later).

If the cured product (silicone gel) of the silicone gel composition in the present invention is used as a sealing material for electronic parts such as power devices, there is no possibility of contamination by oil bleeding, regardless of the usage environment.

EXAMPLES

Hereinafter, the present invention is described specifically with reference to Examples and Comparative Examples, but the present invention is not to be considered limited to the following Examples. It is to be noted that in the following Examples, the term "parts" means "parts by weight", and the viscosity is expressed by a measurement value in a method of measurement with a rotational viscometer at 25° C. Me represents a methyl group. In addition, the degree of polymerization represents a polystyrene-equivalent number average degree of polymerization in gel permeation chromatography (GPC) analysis with toluene as a developing solvent.

Component (A)

(A-1) Branched polysiloxane blocked with dimethylvinylsilyl groups at molecular chain ends, of about 0.3 Pa·s in viscosity at 25° C., represented by the following formula (4):

[Chem. 3]

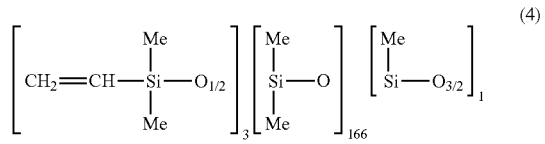

(4)

(A-2) Polysiloxane blocked with dimethylvinylsilyl groups at both molecular chain ends, of about 1.0 Pa·s in viscosity at 25° C., represented by the following formula (5):

[Chem. 4]

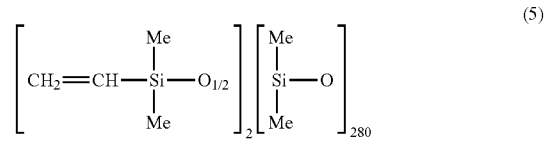

(5)

Component (B)

(B-1) Organohydrogenpolysiloxane of about 20 mPa·s in viscosity at 25° C., represented by the following formula (6):

[Chem. 5]

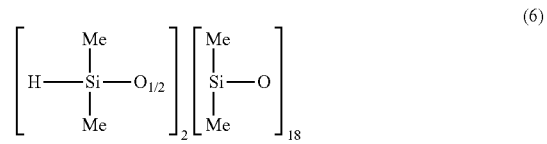

(6)

(B-2) Organohydrogenpolysiloxane of about 10 mPa·s in viscosity at 25° C., represented by the following formula (7):

[Chem. 6]

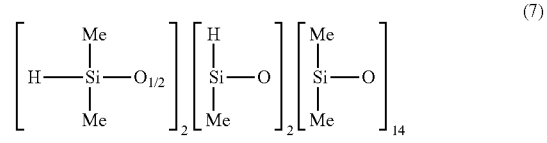

(7)

(B-3) Organohydrogenpolysiloxane of about 110 mPa·s in viscosity at 25° C., represented by the following formula (8):

[Chem. 7]

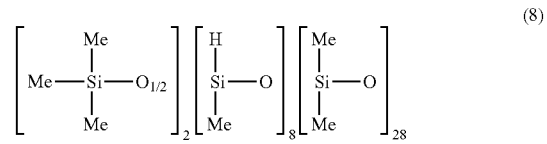

(8)

Component (C)

Solution of chloroplatinic acid-vinylsiloxane complex with the organopolysiloxane represented by the following formula (9) as a solvent (platinum atom content: 1% by weight)

[Chem. 8]

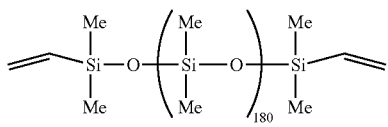

(9)

(D-1) Catalyst activity (reaction rate) inhibitor:
100% solution of ethynylmethyldecylcarbinol Examples 1-3, Comparative Examples 1-4

The above-mentioned components (A) to (C) were compounded and mixed as shown in Table 1 to prepare silicone gel compositions S1 to S7. In Table 1, "(B)SiH/(A)SiVi" refers to the ratio of the mole number (SiH (mol)) of hydrogen atoms bonded to silicon atoms in the component (B) to the total mole number (SiVi (mol)) of vinyl groups bonded to silicon atoms in the component (A) in the silicone gel composition. The prepared silicone gel compositions S1 to S7 were heated at 120° C. for 30 minutes to obtain silicone gel cured products. The degrees of penetration of the obtained cured products were measured. It is to be noted that the degrees of penetration were measured by the test method specified in JIS K2220. Furthermore, in accordance with the following methods, the amounts of free oil (uncrosslinked oil) components in the silicone gel cured products were measured, and the oil bleeding was evaluated. These results are also shown together in Table 1.

[Measurement of Free Oil Content]

With the use of the seven types of silicone gel cured products obtained in Examples and Comparative Examples mentioned above, 2 g of the silicone gel cured product was put in a piece of cylindrical filter paper, and immersed in 100 g of toluene at 23° C. for 1 day (24 hours) to extract a free oil component from the silicone gel cured product. The cylindrical filter paper containing the silicone gel cured product was taken out, and left to stand in a dryer at 120° C. for half a day (12 hours) to remove the toluene fraction. The weight change (i.e., the extraction amount of the free oil component) of the silicone gel cured product between before and after the immersion in toluene was measured, thereby quantifying the extraction amount of the free oil component from the silicone gel cured product as the free oil content in the silicone gel cured product.

[Oil Bleeding Evaluation]

The silicone gel cured products (cubes each of about 1 cm on a side) obtained in the Examples and Comparative Examples mentioned above were each placed on ground glass, and left at room temperature (23° C.) for one month. After being left, the silicone gel cured products were evaluated as ○ if the free oil components in the silicone gel cured products were found not bleeding, or as x if the silicone gel cured products were found bleeding.

According to Table 1, the compositions in Examples 1 to 3 satisfy the requirements of the present invention, with the result that the free oil amounts contained in the cured products are much smaller as compared with Comparative Example 1 to 4 although the compositions are low elastic modulus silicone gels. Furthermore, as for the cured products obtained in Examples 1 to 3, no free oil component was found bleeding into the ground glass.

TABLE 1

| | | Example | | | Comparative Example | | | |
|---|---|---|---|---|---|---|---|---|
| | | 1 | 2 | 3 | 1 | 2 | 3 | 4 |
| Silicone gel composition | | S1 | S2 | S3 | S4 | S5 | S6 | S7 |
| Compounding | (A-1) | 50 | 20 | 20 | 80 | 100 | — | — |
| amount | (A-2) | 50 | 80 | 80 | 20 | — | 100 | 100 |
| (parts by | (B-1) | 14 | 11.4 | — | 16 | 17.6 | 6.1 | 3 |
| weight) | (B-2) | — | — | 7 | — | — | — | — |
| | (B-3) | — | — | — | — | — | 0.3 | 0.5 |
| | (C-1) | 0.06 | 0.06 | 0.06 | 0.06 | 0.06 | 0.06 | 0.06 |
| | (D-1) | 0.02 | 0.02 | 0.02 | 0.02 | 0.02 | 0.02 | 0.02 |
| (B) SiH/(A)SiVi (mol/mol) | | 0.93 | 0.98 | 0.91 | 0.86 | 0.84 | 0.80 | 0.56 |
| Degree of penetration | | 60 | 58 | 55 | 62 | 58 | 60 | 50 |
| Free oil (%) | | 10 | 4.8 | 5.3 | 19 | 20 | 27 | 28 |
| Oil bleeding evaluation | | ○ | ○ | ○ | X | X | X | X |

The invention claimed is:

1. A silicone gel composition comprising the following components (A), (B) and (C), which is cured to provide a silicone gel cured product that has a degree of penetration of 40 to 100 specified by JIS K 2220 and a free oil content of 15% by weight or less:
(A) 100 parts by weight of an organopolysiloxane containing at least two alkenyl groups bonded to silicon atoms in one molecule, comprising the following component (a-1) and component (a-2), provided that the weight ratio of the component (a-1) in the component (A): (a-1)/{(a-1)+(a-2)} is 0.1 to 0.5;
(a-1) a branched organopolysiloxane represented by the following general formula (1), having at least three alkenyl groups bonded to silicon atoms only at end of molecular chain in one molecule:

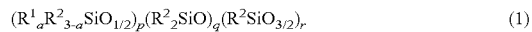

(1)

wherein $R^1$ is an identical or different alkenyl group having 2 to 10 carbon atoms, $R^2$ is an identical or different monovalent hydrocarbon group having 1 to 10 carbon atoms, excluding aliphatic unsaturated groups, a is 1 or 2, p, q and r are respectively integers of $3 \leq p$, $50 \leq q$, $1 \leq r \leq 10$, with $r < p$ and $0.001 \leq r/q \leq 0.2$,
(a-2) a linear organopolysiloxane represented by the following general formula (2), having at least two alkenyl groups bonded to silicon atoms only at both ends of molecular chain in one molecule:

$$(R^1_a R^2_{3-a} SiO_{1/2})_2 (R^2_2 SiO)_s \quad (2)$$

wherein $R^1$, $R^2$ and a are as mentioned above, and s is an integer of 10 to 1,000, (B) a linear organohydrogenpolysiloxane represented by the following average composition formula (3), containing at least two hydrogen atoms bonded to silicon atoms in one molecule in an amount such that hydrogen atoms bonded to silicon atoms in the component (B) are 0.8 to 2 mol per 1 mol in total of alkenyl groups in the component (A):

$$(H_b R^3_{3-b} SiO_{1/2})_t (HR^3 SiO)_u (R^3_2 SiO)_{1-t-u} \quad (3)$$

wherein $R^3$ is an identical or different monovalent hydrocarbon group having 1 to 10 carbon atoms, excluding aliphatic unsaturated groups, b is 1 or 2, t is a positive number of 0.001 to 0.3, and u is a number from 0 to 0.2, and (C) an effective amount as a catalyst of a platinum-based curing catalyst.

2. The silicone gel composition according to claim 1, wherein in the general formula (1) of the component (a-1), $0.003 \leq r/q \leq 0.015$.

3. A silicone gel cured product which is a cured product of the silicone gel composition according to claim 1, wherein the cured product has a degree of penetration of 40 to 100 specified by JIS K2220 and a free oil content of 15% by weight or less.

4. A power module comprising a layer of the silicone gel cured product according to claim 3.

* * * * *